United States Patent [19]

Basmajian et al.

[11] 4,157,583
[45] Jun. 5, 1979

[54] CIRCUIT BOARD CLAMPING ASSEMBLY

[75] Inventors: Fred J. Basmajian; Ronald C. Kurtz, both of Binghamton, N.Y.

[73] Assignee: General Electric Company, Utica, N.Y.

[21] Appl. No.: 848,631

[22] Filed: Nov. 4, 1977

[51] Int. Cl.² .......................... H02B 1/04; H05K 1/00
[52] U.S. Cl. .................... 361/388; 361/399; 361/415
[58] Field of Search ................ 361/415, 399; 211/41, 211/45; 339/17 LM, 66 M, 91 R

[56] References Cited

U.S. PATENT DOCUMENTS

| 3,467,891 | 9/1969 | Mogle | 361/391 |
|---|---|---|---|
| 3,845,359 | 10/1974 | Fedele | 361/415 |
| 3,970,198 | 7/1976 | Prater | 211/41 |
| 3,975,805 | 8/1976 | Spurling et al. | 361/415 |

Primary Examiner—David Smith, Jr.

[57] ABSTRACT

An improved mechanical arrangement is disclosed for removably attaching a circuit board to a mounting box. An edge portion of the circuit board containing the board's heat conductive strip slides between two elongated heat sink guides attached to the mounting box, the edge portion containing a vertical cam shaft with an eccentric cam exerts pressure upon one of the heat sink guides in response to a rotation of the cam shaft by an attached lever-type handle. Since the cam shaft is attached by support members to the circuit board, the shaft acts as a beam spring so as to force the heat conductive strip against the second of the heat sink guides.

8 Claims, 3 Drawing Figures

CIRCUIT BOARD CLAMPING ASSEMBLY

BACKGROUND OF THE INVENTION

1. Field Of The Invention

The present invention relates to a circuit board clamping assembly for removably retaining a circuit board in a circuit board mounting box.

2. Description Of The Prior Art

A clamping assembly for printed circuit boards, which forces the printed circuit board against a guide within a mounting box has already been described in U.S. Pat. No. 3,467,891, issued to R. A. Mogle.

The device shown in the Mogle patent contains a cam cylinder controlled by a lever type handle. After sliding the printed circuit board assembly into a pair of guides located in the mounting box, the lever type handle is turned, thereby rotating the cam cylinder. The rotation of the cylinder has the effect of compressing a spring located below the cylinder and putting axial pressure on a number of roller members located below the spring. The pressure on the roller members forces them to push outwardly (laterally) on a pressure retaining plate located on the side of the roller, thereby forcing the plate into intimate contact with the walls of the frame guide. Rotation of the cam cylinder in the opposite direction has the effect of removing the compression on the spring thereby reducing the pressure on the roller members and pressure retainer plate and allowing the assembly to be removed from the mounting box.

Although the Mogle device performs a similar function as the instant invention, it contains a greater number of components and involves a much more complicated operation.

Accordingly, it is an object of the present invention to provide a simple, relatively inexpensive and easily manufactured circuit module, clamping, retaining and extracting system.

A further object is to provide a means to exert higher clamping forces so as to insure a better thermal interface between the circuit board and an adjacent heat sink section of the circuit board mounting frame.

It is a further object to provide a latching means including a handle that requires only a 180° rotation to provide the high clamping force that secures the circuit board to the main frame.

An additional object is to utilize the self contained handle as levers against an adjacent unit surface to provide the means to extract the circuit board from the mounting frame or mounting box.

SUMMARY OF THE INVENTION

The improved circuit board clamping assembly of this type according to the present invention is characterized by the fact that a cam shaft containing an eccentric cam is connected to the frame of the circuit board by support members through which the shaft can be rotated. The eccentric cam makes contact with a first elongated guide attached to the frame of the mounting box. As the cam shaft is turned by a lever-type handle, the cam is rotated so as to exert pressure on the first guide. This results in the cam shaft acting as a strong beam spring, exerting pressure on the support members and correspondingly on a heat conductive strip attached to the circuit board frame. This forces the heat conductive strip into heat conductive contact with a second elongated guide made of heat conductive material.

Since the cam shaft acts as a strong beam spring this invention provides much higher clamping force per unit volume than other spring type devices.

When a plurality of circuit boards are secured in a mounting box, the first elongated guide can be made of heat conducting material and thereby not only come into contact with the eccentric cam on one circuit board but also the heat conductive strip on an adjacent circuit board.

BRIEF DESCRIPTION OF THE DRAWINGS

Various other objects, features and attendant advantages of the present invention will be more fully appreciated from the following detailed description when considered in connection with the accompanying drawings.

DESCRIPTION OF THE PREFERRED EMBODIMENT

Figure 1:
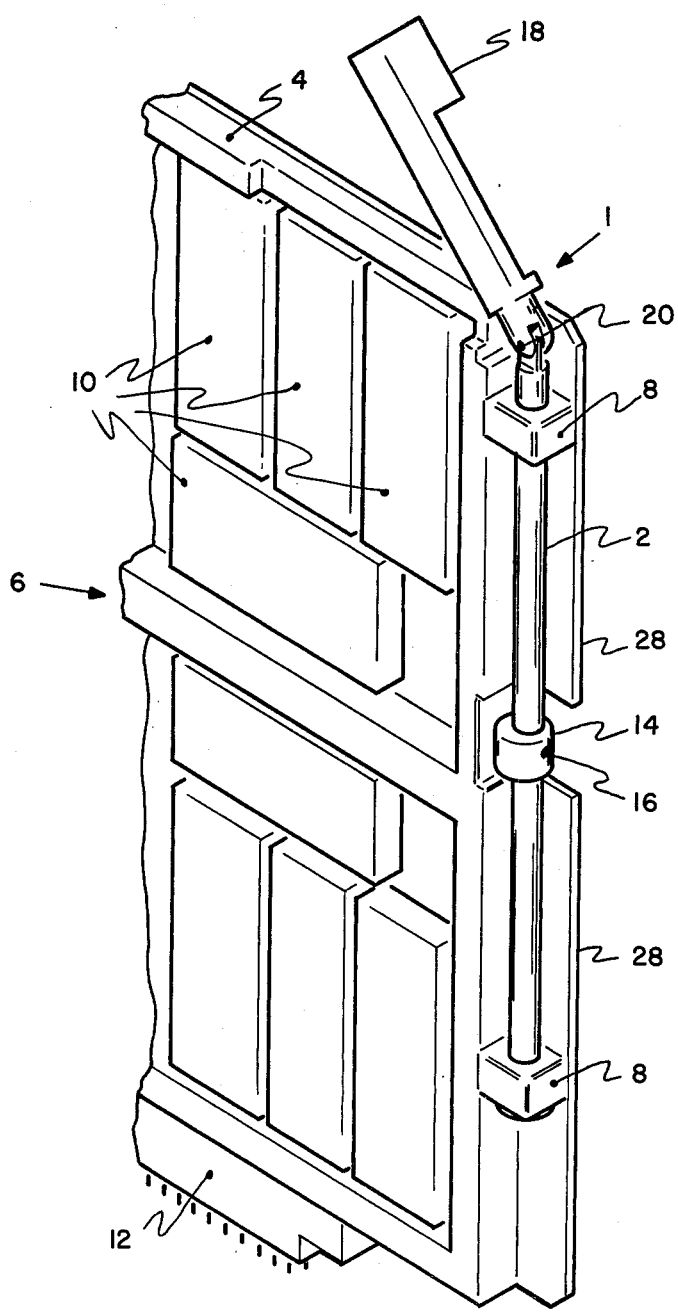
FIG. 1 is a perspective view of the clamping mechanism mounted on a circuit board according to the present invention.
Figure 2:
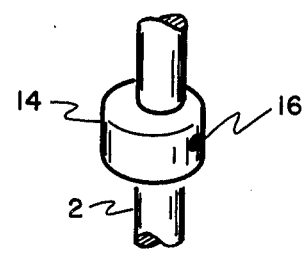
FIG. 2 is an exploded and isolated view of the eccentric cam mounted on the cam shaft.

Referring now to the drawings, and more specifically to FIGS. 1 and 2 thereof, there is shown generally a cam shaft 2 secured to the frame 4 on one edge of a circuit board 6 by means of support members 8. Circuit board 6 is shown with mounted electronic components 10 e.g., integrated circuits, flatpacks, etc.. Connector 12 is shown to illustrate that connections to external circuitry must be made to a matching connector located in a mounting box into which circuit board 6 is to be placed.

Cam member 14 is an eccentric cam securely mounted on cam shaft 2 by means of retaining pin 16. Latching means are provided for by latching handle 18 which is pivotably mounted on cam shaft 2 by means of a retaining pin 20.

Figure 3:
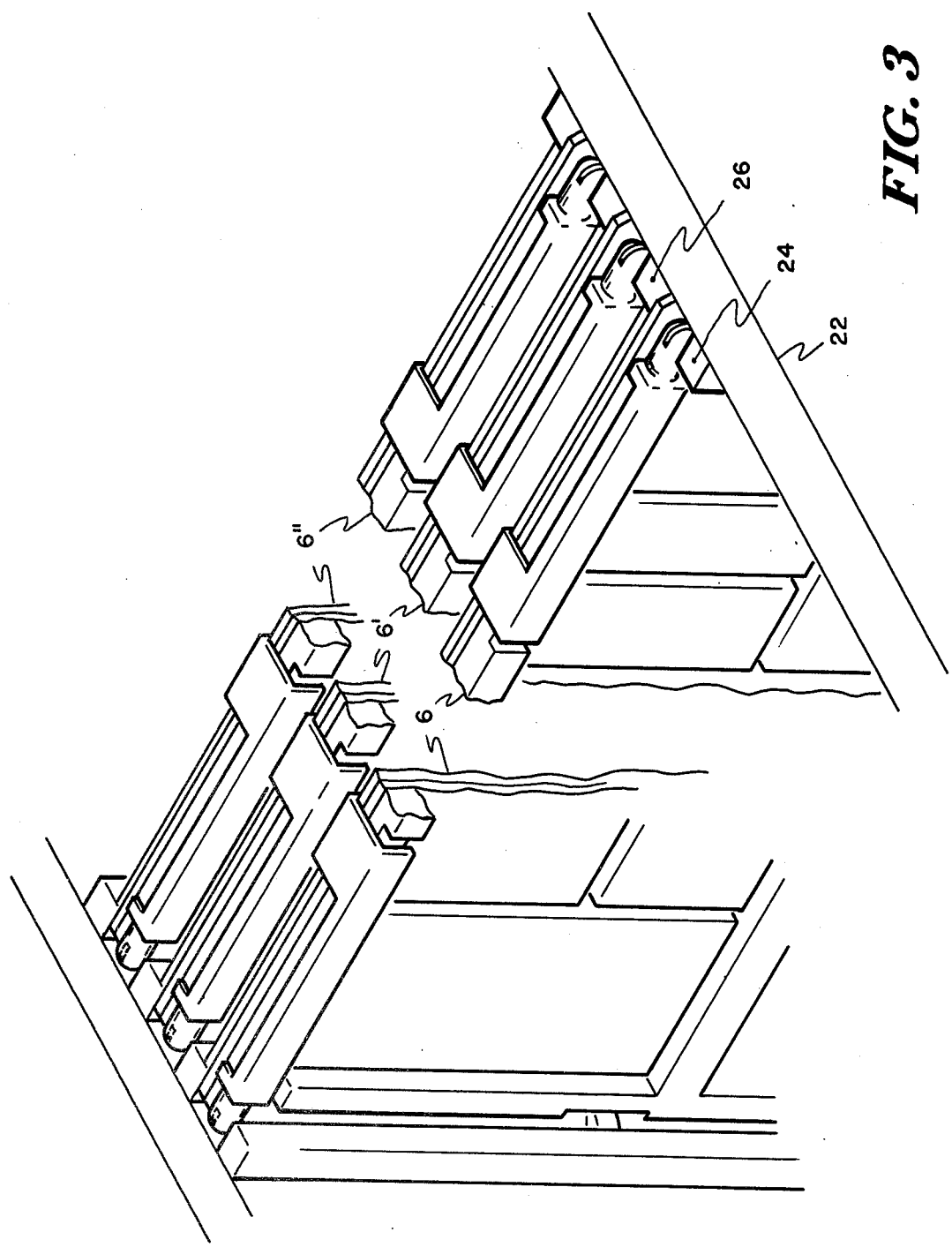
FIG. 3 is a perspective view, partially broken away, of a circuit board mounting box having circuit boards anchored thereto by means of the clamping assembly of the present invention.

In the arrangement shown in FIG. 3, the circuit board mounting box 22 illustrated with a first guide 24 and a second guide 26, between which circuit board 6 is located. Another circuit board 6' is shown adjacent to circuit board 6 in order to show how guides 24 and 26 can be utilized as both a cam contact and a heat sink, as will be delineated herein.

Latching handle 18 can be turned so as to rotate cam shaft 2 and thereby rotate cam member 14.

In order to slide circuit board 6 into mounting box 22, between guides 24 and 26, latching handle 18 must be turned so as to place cam member 14 in a position so that its curved surface will not come in contact with the first elongated guide 24. Once circuit board 6 is slid deep enough into mounting box 22 so as to have connector 12 make contact with its matching connector in order to achieve electrical contact with external circuitry, latching handle 18 can be turned approximately 180° in order to achieve a maximum clamping force. The position of handle 18 in FIG. 1 is such as to place cam member 14 in a position that would exert the maximum amount of force on guide 24.

The maximum clamping force is achieved as cam shaft 2 is rotated so that cam member 14 makes lateral physical contact with guide 24. In so doing a force will be exerted on support members 8 via cam shaft 2 which will now be acting as a beam spring.

The lateral force upon support members 8 will have the effect of pushing heat conductive strip 28 into close physical heat conducting contact with guide 26.

Once this maximum clamping force has been attained, latching handle 18 can be pivoted about its retaining pin 20 so as to lie flush to the top side of circuit board 6. (FIG. 3) Circuit board 6 can easily be removed from mounting box 22 by reversing the aforementioned operations.

An additional feature of the inventions is the design of latching handle 18 so as to restrict the angle that handle 18 makes with the top of circuit board 6 to an acute angle as shown in FIG. 1. Once lifted to this acute angle and rotated 180° there will be no lateral force exerted by cam member 14. Then the lower edge of latching handle 18 will be in a position to come into contact with an adjacent unit suface, such as the edge of mounting box 22 which will act as a fulcrum, thereby allowing handle 18 to function as a lever in raising circuit board 6.

As shown in FIG. 3 clamping mechanism 1 as delineated above, can be used at each end of a circuit board. The invention can also be used on adjacent boards 6' and 6''. In such a configuration the second guide 26 which acts as a heat sink for circuit board 6 via heat conductive strip 28, also acts as a first guide for circuit board 6'.

This means that the cam member located on circuit board 6' will be exerting pressure one side of guide 26 while heat conductive strip 28 of circuit board 6 is exerting pressure on the opposite side of guide 26. In an analogous fashion, when a plurality of circuit boards are placed in mounting box 22 each guide located between any two adjacent circuit boards will be facing a cam member 14 of one board, and a heat conductive strip 28 of an adjacent board on its opposite face.

The instant invention by the use of cam shaft 2 as a strong beam spring is able to exert higher clamping forces within a given volume than other spring type devices. For this reason a better thermal interface can be realized between the circuit board and the heat sink elements located on the mounting box.

While a preferred embodiment of the invention has been shown and described, various other embodiments and modifications thereof will become apparent to persons skilled in the art, and will fall within the scope of invention as defined in the following claims.

What is claimed as new and desired to be secured by Letters Patent of the United States is:

1. A circuit board assembly comprising:
   a cam shaft secured alongside an edge of said circuit board by an attachment means by which the cam shaft is rotatably supported;
   a first cam member mounted on said cam shaft for movement therewith;
   a mounting frame to support said circuit board;
   a first elongated guide attached to said mounting frame, one side of said first guide mounted adjacent to the front side of said circuit board;
   a second elongated guide attached to said mounting box, one side of said second guide mounted adjacent to the back side of said circuit board;
   a heat conductive strip located alongside said circuit board adjacent to said second guide; and
   latching means secured to said cam shaft to rotate said cam shaft upon rotation of said latching means, whereby said first cam member pushes in a direction perpendicular to the axis of said cam shaft against said first guide thereby exerting an opposite lateral force at said attachment means to force said heat conductive strip into intimate contact with said second guide, said latching means further comprising a handle attached to said cam shaft at a pivot connection, so that the handle can rest flush to the top of said circuit board when the board is secured in the mounting box and be pivoted at an acute angle with respect to its resting position, and turned 180° so as to rotate the cam shaft and relieve the pressure which said cam exerts upon said first guide, and using a lever type action said handle can be pushed in a downward direction against an adjacent unit surface so as to lift the circuit board from said mounting box.

2. The invention of claim 1 wherein said attachment means further comprises a plurality of support members attached to said circuit board.

3. The invention of claim 1 wherein said second guide is of heat conducting material to make heat conducting contact with said heat conductive strip.

4. The invention of claim 3 wherein said first guide is of heat conducting material to make heat conducting contact with a second heat conductive strip of a second circuit board mounted adjacent to said circuit board.

5. A pair of heat conducting clamping mechanisms positioned on opposite ends of a frame on a circuit board, each of said clamping mechanisms comprising:
   a cam shaft secured alongside an edge of said circuit board by an attachment means by which the cam shaft is rotatably supported;
   a first cam member mounted on said cam shaft for movement therewith;
   a mounting frame to support said circuit board;
   a first elongated guide attached to said mounting frame, one side of said first guide mounted adjacent to the front side of said circuit board;
   a second elongated guide attached to said mounting box, one side of said second guide mounted adjacent to the back side of said circuit board;
   a heat conductive strip located alongside said circuit board adjacent to said second guide; and
   latching means secured to said cam shaft to rotate said cam shaft upon rotation of said latching means, whereby said first cam member pushes in a direction perpendicular to the axis of said cam shaft against said first guide thereby exerting an opposite lateral force at said attachment means to force said heat conductive strip into intimate contact with said second guide, said latching means further comprising a handle attached to said cam shaft at a pivot connection, so that the handle can rest flush to the top of said circuit board when the board is secured in the mounting box and be pivoted at an acute angle with respect to its resting position, and turned 180° so as to rotate the cam shaft and relieve the pressure which said cam exerts upon said first guide, and using a lever type action said handle can be pushed in a downward direction against an adjacent unit surface so as to lift the circuit board from said mounting box.

6. The invention of claim 5 wherein said attachment means further comprises a plurality of support members attached to said circuit board.

7. The invention of claim 5 wherein said second guide is of heat conducting material to make heat conducting contact with said heat conductive strip.

8. The invention of claim 7 wherein said first guide is of heat conducting material to make heat conducting contact with a second heat conductive strip of a second circuit board mounted adjacent to said circuit board.

* * * * *